(12) United States Patent
Wight

(10) Patent No.: US 7,042,927 B2
(45) Date of Patent: May 9, 2006

(54) PSEUDO-NOISE CARRIER SUPPRESSION/IMAGE REJECTION UP AND DOWN CONVERTERS

(76) Inventor: James Stuart Wight, 300 Queen Elizabeth Dr., Apt. 9A, Ottawa, Ontario (CA) K1V 3M6

( * ) Notice: Subject to any disclaimer, the term of this patent is extended or adjusted under 35 U.S.C. 154(b) by 765 days.

(21) Appl. No.: 10/094,826

(22) Filed: Mar. 11, 2002

(65) Prior Publication Data

US 2002/0136275 A1 Sep. 26, 2002

Related U.S. Application Data

(60) Provisional application No. 60/277,941, filed on Mar. 23, 2001.

(51) Int. Cl.
*H04B 1/707* (2006.01)

(52) U.S. Cl. ............... 375/147; 375/146; 375/295; 375/316

(58) Field of Classification Search ........ 375/146–147, 375/279, 281, 284, 295, 308, 316, 329, 331, 375/367, 130, 135, 136, 324–326; 332/103–104, 332/144; 329/304, 345, 346
See application file for complete search history.

(56) References Cited

U.S. PATENT DOCUMENTS

| | | | |
|---|---|---|---|
| 5,467,367 A | | 11/1995 | Izumi et al. |
| 5,539,775 A | | 7/1996 | Tuttle et al. |
| 5,598,154 A | * | 1/1997 | Wilson et al. ............. 341/50 |
| 5,623,485 A | * | 4/1997 | Bi ........................... 370/209 |
| 5,687,166 A | * | 11/1997 | Natali et al. ............. 370/209 |
| 5,838,717 A | * | 11/1998 | Ishii et al. ................ 375/131 |
| 6,198,764 B1 | * | 3/2001 | Schuermann et al. ..... 375/130 |
| 6,215,813 B1 | | 4/2001 | Jones et al. |
| 2003/0043933 A1 | * | 3/2003 | Kintis ....................... 375/308 |

FOREIGN PATENT DOCUMENTS

DE 197 44 428 C1 2/1999
EP 0 562 529 A2 2/1999

* cited by examiner

*Primary Examiner*—Khanh Tran
(74) *Attorney, Agent, or Firm*—Berkeley Law & Technology Group

(57) ABSTRACT

Pseudo-noise (PN) carrier suppression up-converter and pseudo-noise image sideband rejection up-converter and down-converter circuits are provided. The image sideband rejection circuits enable the use of single step up-conversion without the need for the high Q filters associated with two-step up-conversion architectures. For carrier suppression, the frequency spectrum of an input signal is PSK (BPSK or QPSK) spread by a PN signal and the spread signal is up-converted using a PSK (BPSK or QPSK) modulated carrier (local oscillator) modulated by the same PN sequence. In an up-converter, a carrier is QPSK modulated using independent PN sequences and the frequency spectrum of the input signal is QPSK spread using the same independent PN sequences whereby image sideband rejection results upon up-converting the QPSK spread signal in a mixer using the QPSK modulated carrier. In a down-converter, a carrier signal which is QPSK modulated by independent PN sequences is used to down-convert an input signal in a mixer and the resulting down-converted signal is QPSK spread using the same independent PN sequences whereby image sideband rejection occurs.

11 Claims, 8 Drawing Sheets

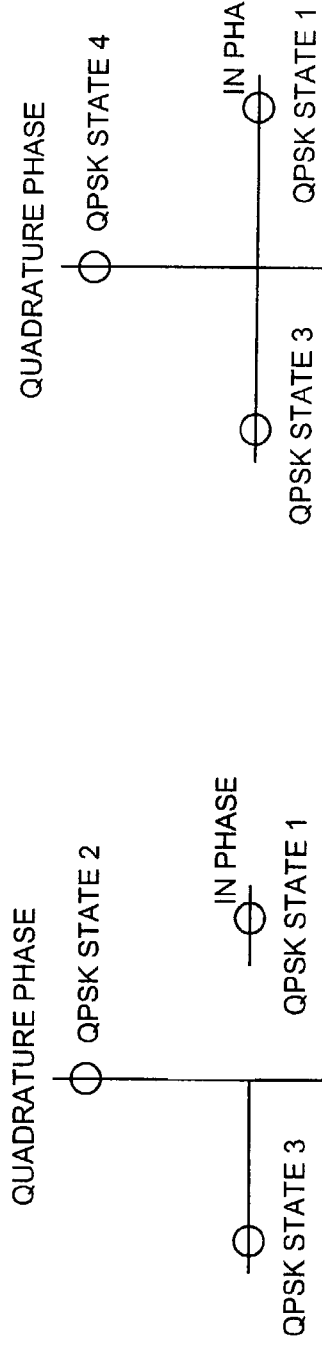
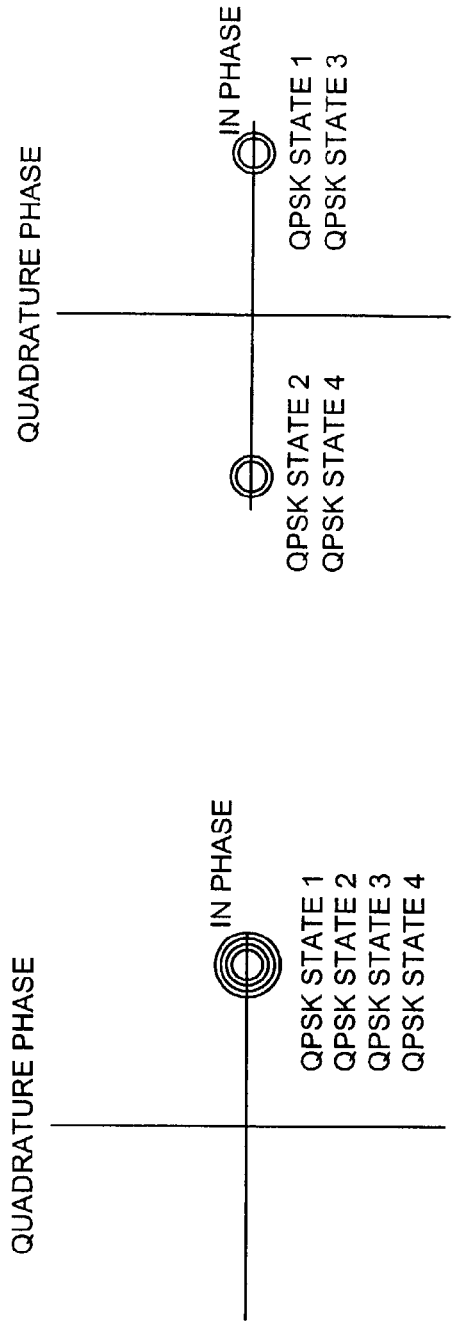
FIG. 5A
FIG. 5B
FIG. 5C
FIG. 5D

PSEUDO-NOISE CARRIER SUPPRESSION/IMAGE REJECTION UP AND DOWN CONVERTERS

FIELD OF THE INVENTION

The invention relates to transceivers and, in particular, to radio frequency (RF) circuitry providing improved signal up and down conversion.

BACKGROUND OF THE INVENTION

In the RF transmitter portion of a transceiver data is typically scrambled, encoded, and interleaved before being modulated and then up-converted and amplified for transmission. The receiver portion of the transceiver performs the reverse processes including down-converting the RF received signal to baseband.

Conventional single step (also referred to as direct carrier modulation) up-converters have been unable to achieve satisfactory suppression of the undesired image sideband which, as a result of the up-conversion process performed by a mixer, is generated in addition to the desired sideband. Equally, such conventional single step up-converters have been unable to achieve satisfactory suppression of any local-oscillator feed through.

Suppression of the image sideband can be achieved with the use of a high Q, off-chip RF filter; however to achieve low loss and stable frequency, this presents a high cost solution.

The use of two-step up-converters (a first one used to up-convert to an IF carrier and a second one used to up-convert to the RF carrier) is one known means of suppressing the image sideband while avoiding the foregoing requirement of single step up-converters for a high Q, off-chip RF filter. Upon a first up-conversion to an IF carrier the image sideband is removed by means of a low Q filter. Then the desired IF sideband is up-converted to an RF carrier and another low Q filter is used to suppress the resultant image sideband and any local oscillator feed through. Although the cut-off bandwidth of each of the filters used in such IF and RF circuits is higher than that required for a single step up-converter, which makes these filters more easily realizable, they are nevertheless high cost, off-chip components the use of which is, preferably, to be avoided.

Another known means of suppressing the image sideband is provided by the conventional image rejection up-converter which splits the baseband signal into two quadrature components, each of which is individually up-converted with a quadrature local oscillator and then the resulting up-converted signals are combined. The undesired image sideband is suppressed in the resultant combined signal without need for an RF filter. However, this conventional image rejection up-converter does not suppress any local oscillator feed through and requires a high degree of phase and amplitude balance in the two up-converters.

The foregoing disadvantages associated with conventional single step and two-step up-converters also apply to their corresponding single step and two-step down-converters.

Accordingly, there is a need for an improved up-converter to provide effective and efficient suppression of any local oscillator feed through. In addition, there is a need for an improved up-converter and down-converter to provide effective and efficient rejection of the image sideband.

SUMMARY OF THE INVENTION

Pseudo-noise (PN) carrier suppression up-converter and pseudo-noise image sideband rejection up-converter and down-converter circuits are provided by the invention claimed herein. Advantageously, the image sideband rejection circuits enable the use of single step up-conversion without the need for the high Q filters associated with two-step up-conversion architectures.

In accordance with the invention there are provided an up-converter and method for up-converting an input signal with a carrier signal whereby carrier suppression is achieved in the up-converted signal. The up-converter comprises means for phase shift keying (PSK) spreading the frequency spectrum of the input signal by a pseudo-noise (PN) signal to produce a spread spectrum input signal, means for phase shift keying (PSK) modulating the carrier signal by the PN signal to produce a modulated carrier signal and means for up-converting the spread spectrum input signal with the modulated carrier signal. The PSK modulation may be biphase shift keying (BPSK) using one PN signal for modulation or quadrature phase shift keying (QPSK) using two independent PN signals applied to quadrature carrier signals. The carrier signal is preferably produced by a local oscillator and the means for up-converting comprises a mixer. In the preferred embodiment, the input signal is digital and the up-converter further comprises a digital-to-analog converter (DAC) for converting the digital input signal to analog before the spreading means produces the spread spectrum input signal. Alternatively, the DAC may convert the spread spectrum input signal to analog before the up-converting means up-converts the spread spectrum input signal.

In accordance with a further aspect of the invention there are provided an up-converter and method for up-converting an input signal with a carrier signal whereby both carrier suppression and image sideband rejection are achieved. The spreading of the input signal is quadrature phase shift keying (QPSK) spreading and the modulation of the carrier signal is quadrature phase shift keying (QPSK) modulating. The QPSK spreading is by two independent PN signals and the QPSK modulating is by the same independent PN signals. The QPSK spreading comprises BPSK spreading the frequency spectrum of quadrature input signals by the independent PN signals to produce a QPSK spread spectrum input signal, the quadrature input signals being produced from the input signal. The QPSK modulating comprises BPSK modulating quadrature carrier signals by same the independent PN signals to produce a QPSK modulated carrier signal, the quadrature carrier signals being produced from the carrier signal.

Also in accordance with the invention there are provided a down-converter and method for down-converting an input signal from a carrier signal. The down-converter comprises means for quadrature phase shift keying (QPSK) modulating an oscillator signal corresponding to the carrier signal by two independent PN signals to produce a QPSK modulated oscillator signal. The QPSK modulating comprises BPSK modulating each one of two quadrature oscillators signals produced from the oscillator signal with a different one of the independent PN signals. Means are provided for down-converting the input signal with the QPSK modulated oscillator signal (e.g. a mixer) to produce a down-converted input signal. Means for quadrature phase shift keying (QPSK) de-spreading the frequency spectrum of the down-converted input signal by the independent PN signals to produce an un-spread, down-converted output signal. The QPSK de-spreading may be performed by BPSK frequency spectrum de-spreading of parallel duplicate down-converted input signals by the independent PN signals whereby the parallel input signals are produced from the down-converted input signal.

BRIEF DESCRIPTION OF THE DRAWINGS

Embodiments of the present invention are described in detail below with reference to the following drawings in which like references pertain to like elements throughout:

FIGS. 5(*a*), (*b*), (*c*) and (*d*) are phasor constellation diagrams provided to pictorial illustrate how the image sideband is converted from QPSK to BPSK to achieve image sideband rejection upon up-conversion in accordance with the invention; FIGS. 5(*a*) and (*b*) illustrate the phasor constellations for each of the desired and image sidebands of a QPSK spread baseband signal in the case of up-conversion by an unmodulated local oscillator and FIGS. 5(*c*) and (*d*) illustrate the phasor constellations for each of the desired and image sidebands of a QPSK spread baseband signal in the case of up-conversion by a QPSK modulated local oscillator in accordance with the invention (it is to be noted that, for purposes of clarity of illustration, no data modulation is shown in these drawings);

DETAILED DESCRIPTION OF ILLUSTRATED EMBODIMENTS

Figure 1:
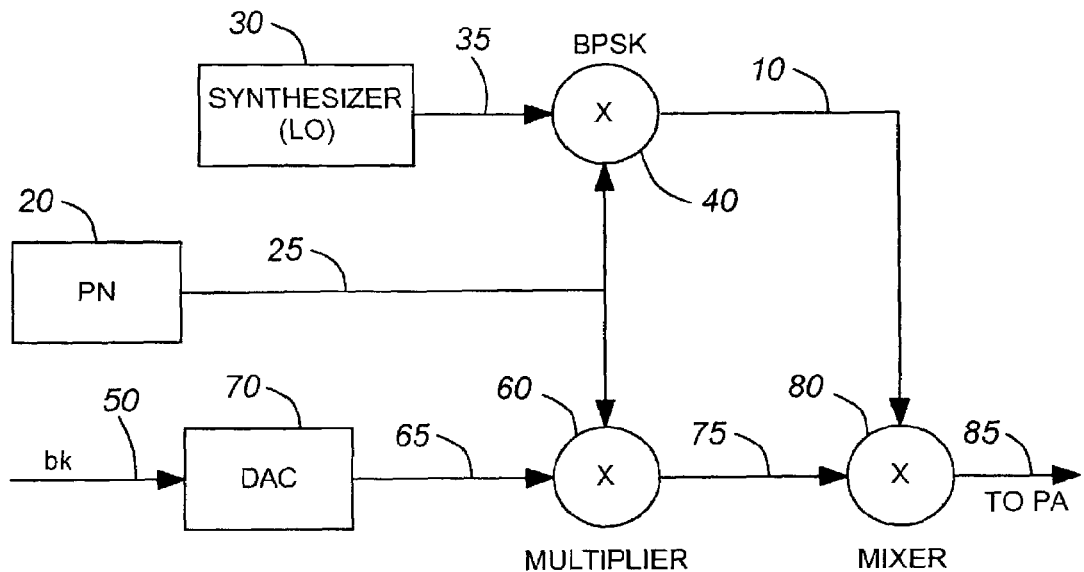
FIG. 1 is a block diagram of a circuit architecture for a pseudo-noise carrier suppression up-converter configured in accordance with one embodiment of the present invention.

The circuit architecture for a carrier suppression pseudo-noise (PN) up-converter in accordance with a first embodiment of the present invention is shown by FIG. 1. As shown, a binary phase shift keying (BPSK) modulation signal 10 is produced by BPSK modulating an oscillator signal 35 output from a local oscillator 30 and that modulated oscillator signal 10 is input to a mixer 80 (i.e. instead of the unmodulated local oscillator (LO) signal 35 as in a conventional up-converter circuit design). Thus, the oscillator signal 35 becomes the carrier signal for the up-converted input signal 50. A PN generator 20 produces a PN sequence 25 (e.g. at a rate of 80 Mega-chips per second) which is used by a BPSK modulator 40 to modulate the oscillator 30 and produce the BPSK modulated oscillator signal 10. The input (baseband) signal 50 (e.g. DC to 10 MHz) is fed to a digital-to-analog converter (DAC) 70 and the analog signal 65 output therefrom is BPSK spread by means of a signal frequency spectrum spreader 60, being a multiplier in the form of a mixer in the illustrated embodiment, using the same PN sequence 25 which modulates the oscillator signal 35. The resulting BPSK spread spectrum signal 75 is input to the mixer 80 (for example, a Gilbert cell mixer is used in one preferred implementation of this embodiment). If desired, for an alternative embodiment, the design shown by FIG. 1 may be modified so as to interchange the order of the DAC 70 and multiplier 60.

Upon up-conversion, performed by the mixer 80, the BPSK spread spectrum associated with the input signal cancels the BPSK modulation of the local oscillator and, therefore, the result is that the desired modulation is produced for the output (RF) signal 85. In addition, any local oscillator feed through is suppressed since the local oscillator 30 is BPSK modulated and, thus, has a reduced power spectral density. Accordingly, this circuit architecture achieves carrier suppression but does not reject the image sideband.

Figure 2:
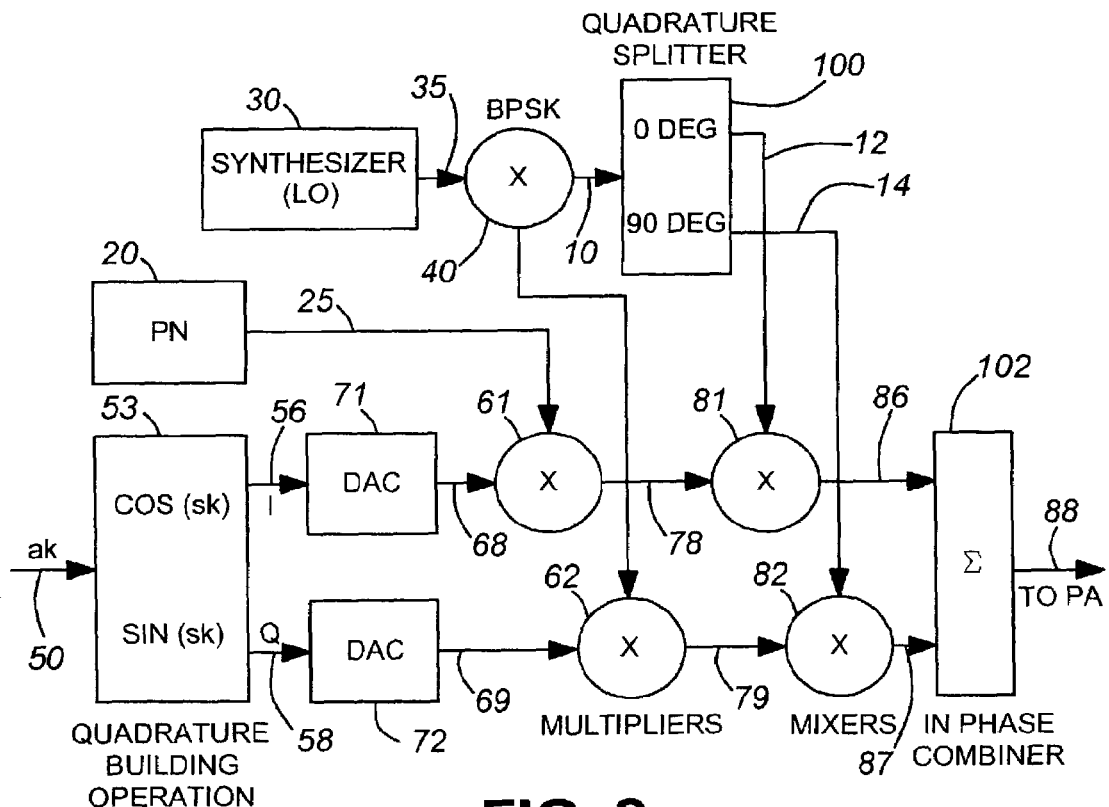
FIG. 2 is a block diagram of a circuit architecture for a pseudo-noise carrier suppression/image rejection up-converter configured in accordance with another embodiment of the present invention.

The circuit architecture shown by FIG. 2 represents a variant of that of FIG. 1. This circuitry achieves both carrier suppression and image rejection, with the latter being achieved by incorporating the carrier suppression circuitry of FIG. 1 into the conventional image rejection up-converter circuit configuration described above. The BPSK modulation signal 10 is fed through a quadrature splitter 100 to produce two quadrature modulation signals 12, 14, each of which has been BPSK modulated with the PN sequence 25. In addition, two quadrature baseband signals I (56) and Q (58) are produced by a real time quadrature splitting operator 53 which calculates the sine and the cosine of the time varying phase of the baseband signal (phasor) 50. Each quadrature baseband signal 56,58 is fed to a digital-to-analog converter (DAC) 71, 72 and the analog signals 68, 69 are BPSK spread by means of multipliers (mixers) 61, 62 using the same PN sequence 25. The resulting BPSK spread spectrum signals 78, 79 are input to separate mixers 82, 81 and the resulting up-converted signals 86, 87 are combined by an in-phase combiner 102 to produce an up-converted output signal 88. If desired, for an alternative embodiment, the design shown by FIG. 2 may be modified so as to interchange the order of the DAC's 71, 72 and multipliers 61, 62.

As for the circuitry of FIG. 1 the BPSK spread spectrums associated with the baseband signals cancel the BPSK modulation of the local oscillator quadrature signals and any local oscillator feed through is suppressed since the local oscillator signals are BPSK modulated and, thus, have reduced power spectral density. Further, upon combining the quadrature up-converted signals, image rejection is achieved.

Figure 3:
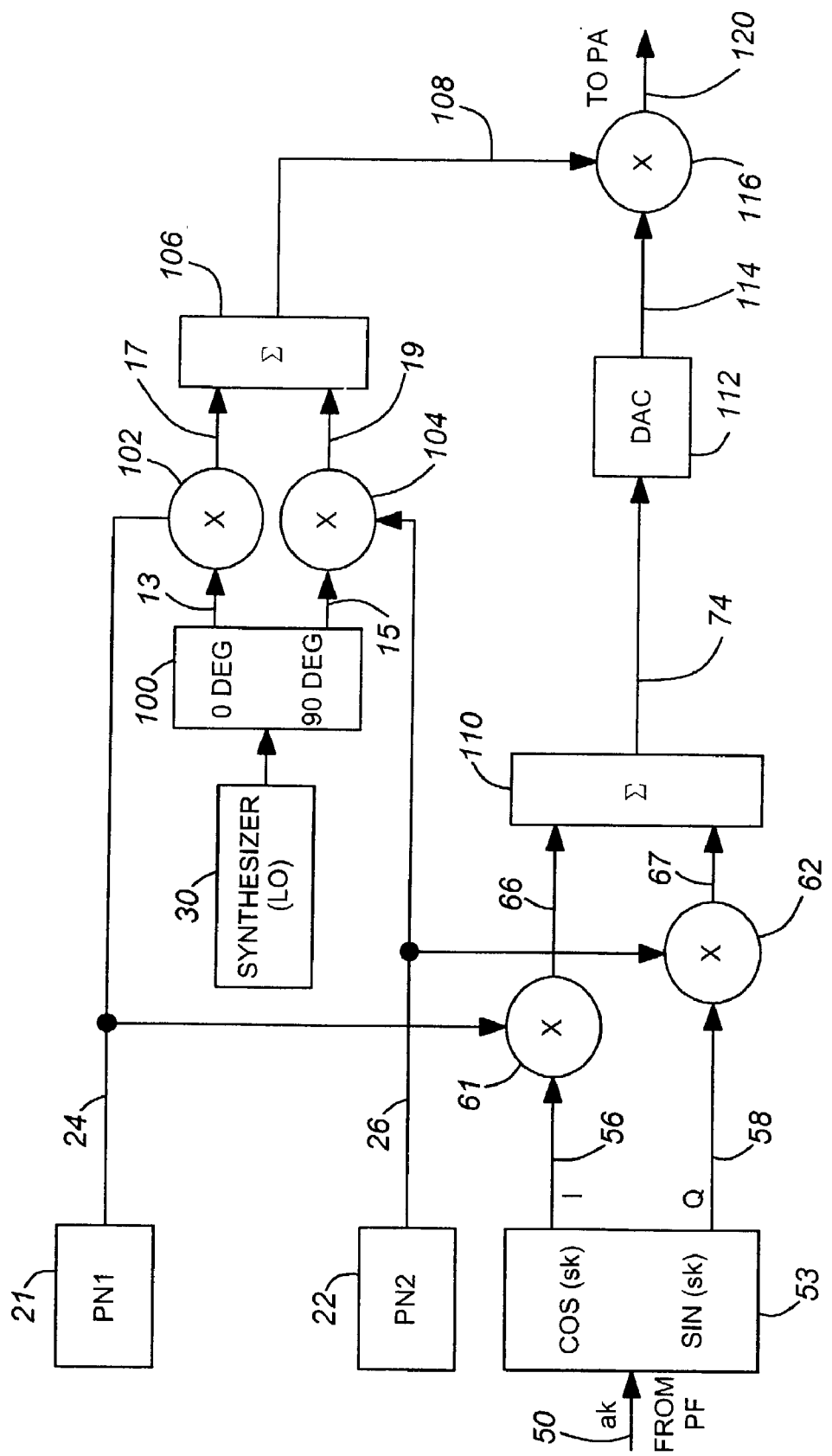
FIG. 3 is a block diagram of a circuit architecture for a pseudo-noise carrier suppression/image rejection up-converter configured in accordance with a further embodiment of the present invention.

FIG. 3 illustrates an exemplary preferred circuit architecture for applicant's novel pseudo-noise image rejection/carrier suppression up-converter which, advantageously, achieves both image sideband rejection and local oscillator feed through suppression. Two independent binary phase shift keying (BPSK) modulated local oscillator signals 17,19 are produced in mixers 102, 104 by BPSK modulating quadrature oscillator signals 13,15 using statistically independent PN sequences 24, 26 generated by PN generators 21, 22. The BPSK modulated oscillator (carrier) signals 17, 19 are combined by a quadrature signal combiner 106 and the resulting QPSK modulated carrier signal 108 is fed to a mixer 116.

In addition, two quadrature baseband signals I (56) and Q (58) are produced by a real time quadrature splitting operator 53 which calculates the sine and the cosine of the time varying phase of the input signal (phasor) 50. Using signal frequency spectrum spreaders 61, 62, being multipliers in the form of mixers in the illustrated embodiment, each quadrature input (baseband) signal 56,58 is BPSK spread by an independent PN sequence 24 or 26, being the same PN sequences used to modulate the quadrature oscillator signals 13, 15. The resulting BPSK spread spectrum signals 66, 67 are combined by a combiner 110 and the resulting QPSK spread spectrum signal 74 is fed to a digital-to-analog converter (DAC) 112. The analog signal 114 output from DAC 112 is input to a mixer 116 to produce an up-converted output signal 120.

Upon up-conversion by the single mixer 116, the QPSK spreading of the baseband signal cancels the QPSK modulation of the local oscillator for the desired sideband. However, for the image sideband, the phase combination of the QPSK spreading and the QPSK modulation results in a BPSK modulated spectrum. Since the BPSK spreading occupies a much broader spectrum than the un-spread image sideband modulation, its power spectral density is decreased and image sideband rejection is thereby achieved. The amount of the resulting image rejection produced by this circuitry is governed by the ratio of the PN chip rate and the baseband modulation rate. In the illustrated preferred embodiment of FIG. 3 the PN chip rate is 80 Mega-chips per second and the baseband modulation rate is 10 MHz so a value of 8 corresponds to the amount of image rejection which is achieved by this circuitry. As for the previous embodiments, the local oscillator feed through is also suppressed since the LO is QPSK modulated and this reduces its power spectral density.

Figure 4:
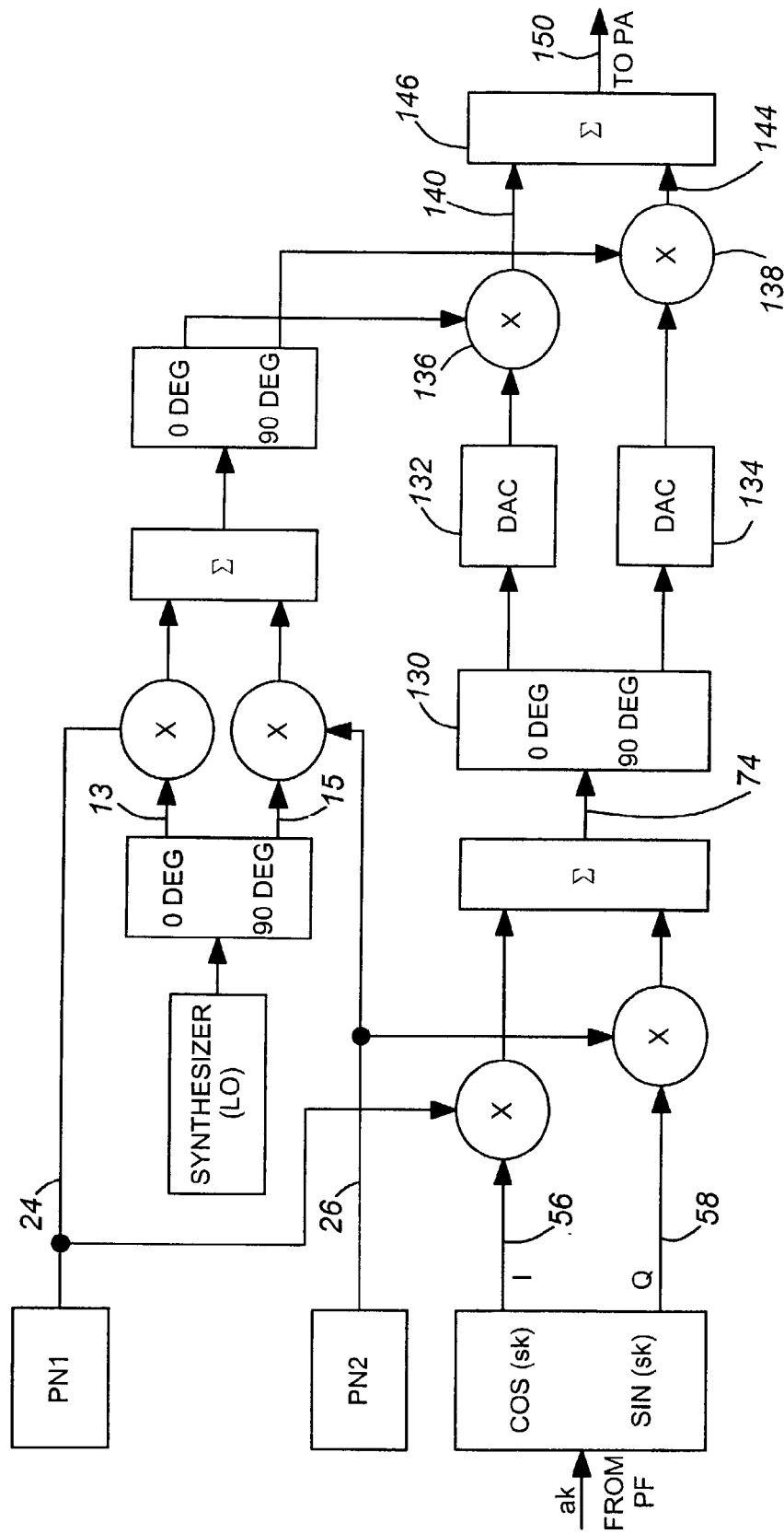
FIG. 4 is a block diagram of a circuit architecture for a pseudo-noise carrier suppression/image rejection up-converter configured in accordance with a further embodiment of the present invention.

FIG. 4 shows a circuit architecture for a carrier suppression/image rejection pseudo-noise up-converter configured as a variant of that of FIG. 3 in that image rejection is achieved by incorporating the carrier suppression/image rejection circuitry of FIG. 3 into the conventional image rejection up-converter circuit configuration described above. The two quadrature oscillator (carrier) signals 13, 15 are each BPSK modulated with an independent PN sequence 24, 26 and the quadrature BPSK modulated oscillator signals are combined to produce a QPSK modulated carrier (oscillator) signal. As shown, in similar manner to the circuitry of FIG. 2, the QPSK modulated oscillator signal is fed to a quadrature splitter to produce quadrature QPSK modulated oscillator signals for input to mixers 136, 138.

The two quadrature input (baseband) signals 56,58 are realized by calculating the sine and the cosine of the time varying phase of the input signal. As for the circuit of FIG. 3 the quadrature input signals are BPSK spread with the independent PN sequences 24, 26 and the spread spectrum signals are then combined to form a QPSK spread spectrum signal 74. The QPSK spread spectrum signal 74 is fed through a quadrature phase splitter 130 and the resulting two quadrature QPSK spread spectrum signals are fed through DAC's 132, 134.

Upon up-conversion in separate mixers 136, 138, the QPSK spreading of the baseband signal cancels the QPSK modulation of the local oscillator for the desired sideband. However, for the image sideband, the phase combination of the QPSK spreading and the QPSK modulation results in a BPSK modulated spectrum. Since the BPSK spreading occupies a much broader spectrum than the un-spread image sideband modulation, its power spectral density is decreased and the amount of image rejection is governed by the ratio of the PN chip rate and the baseband modulation rate. Further image rejection is achieved upon combining the quadrature up-converted signals 140, 144 by a signal combiner component 146. As a result, the RF output signal 150 benefits from image rejection by means of both phase cancellation (i.e. performed by the conventional image rejection circuitry as described with reference to FIG. 2) and the quadrature spread spectrum processing (i.e. as described with reference to FIG. 3). As for each of the circuit embodiments of FIGS. 2 and 3 the local oscillator feed through is also suppressed since the LO is QPSK modulated, thereby reducing its power spectral density.

FIGS. 5(*a*), (*b*), (*c*) and (*d*) are provided to pictorially show how the image sideband is converted from QPSK to BPSK to achieve image rejection upon up-conversion in accordance with the present invention. FIGS. 5(*a*) and (*b*) illustrate the phasor constellations produced for each of the desired and image sidebands of a QPSK spread baseband signal when it is up-converted using a conventional (i.e. unmodulated) local oscillator. FIGS. 5(*c*) and (*d*) illustrate the corresponding phasor constellations produced for each sideband when a QPSK modulated local oscillator is used for up-converting an identically QPSK spread baseband signal (it is to be noted that, for purposes of clarity of illustration, no data modulation is shown in these drawings).

In the case where a conventional local oscillator is used (see FIGS. 5(*a*) and (*b*)) the phasor locations for QPSK spreading states 2 and 4 are interchanged for the desired and image sidebands but the phasor locations for QPSK spreading states 1 and 3 are identical for each sideband. (Note that such use of a conventional LO is not desirable and is shown only for the purpose of illustrating the different phasor locations in the two sidebands.) On the other hand, in the case where a QPSK modulated local oscillator is used (see FIGS. 5(*c*) and (*d*)) all of the spreading states for the desired sideband collapse to the same phasor location, thereby removing the spreading. However, the spreading states for the image sideband collapse to two opposite phasor locations which corresponds to a residual BPSK spreading.

Figure 6:
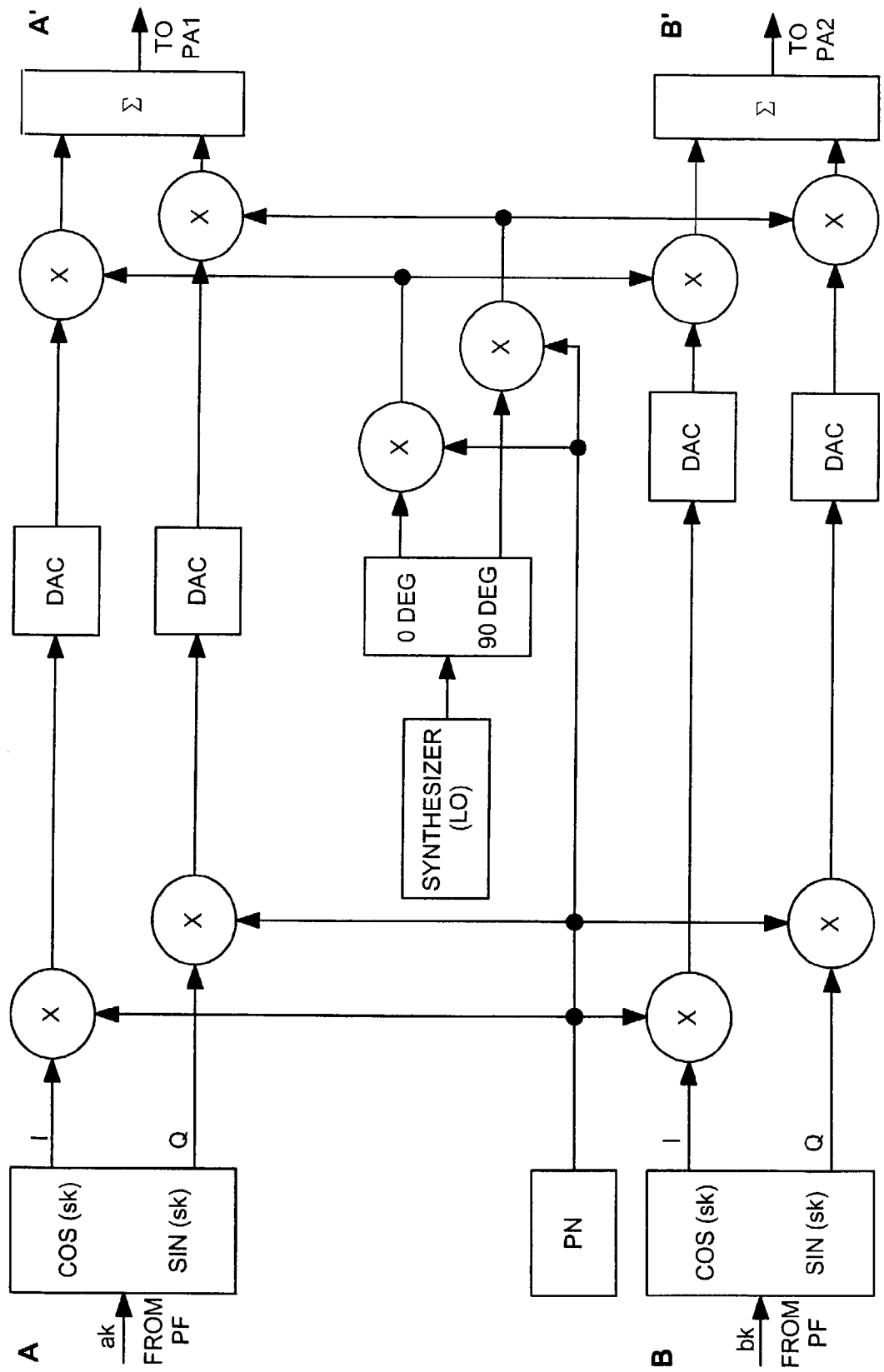
FIG. 6 is a block diagram of a circuit architecture for a pseudo-noise carrier suppression/image rejection up-converter configured according to that of FIG. 2 but driving two parallel channels (i.e. for up-converting two modulated signal fragments)
Figure 7:
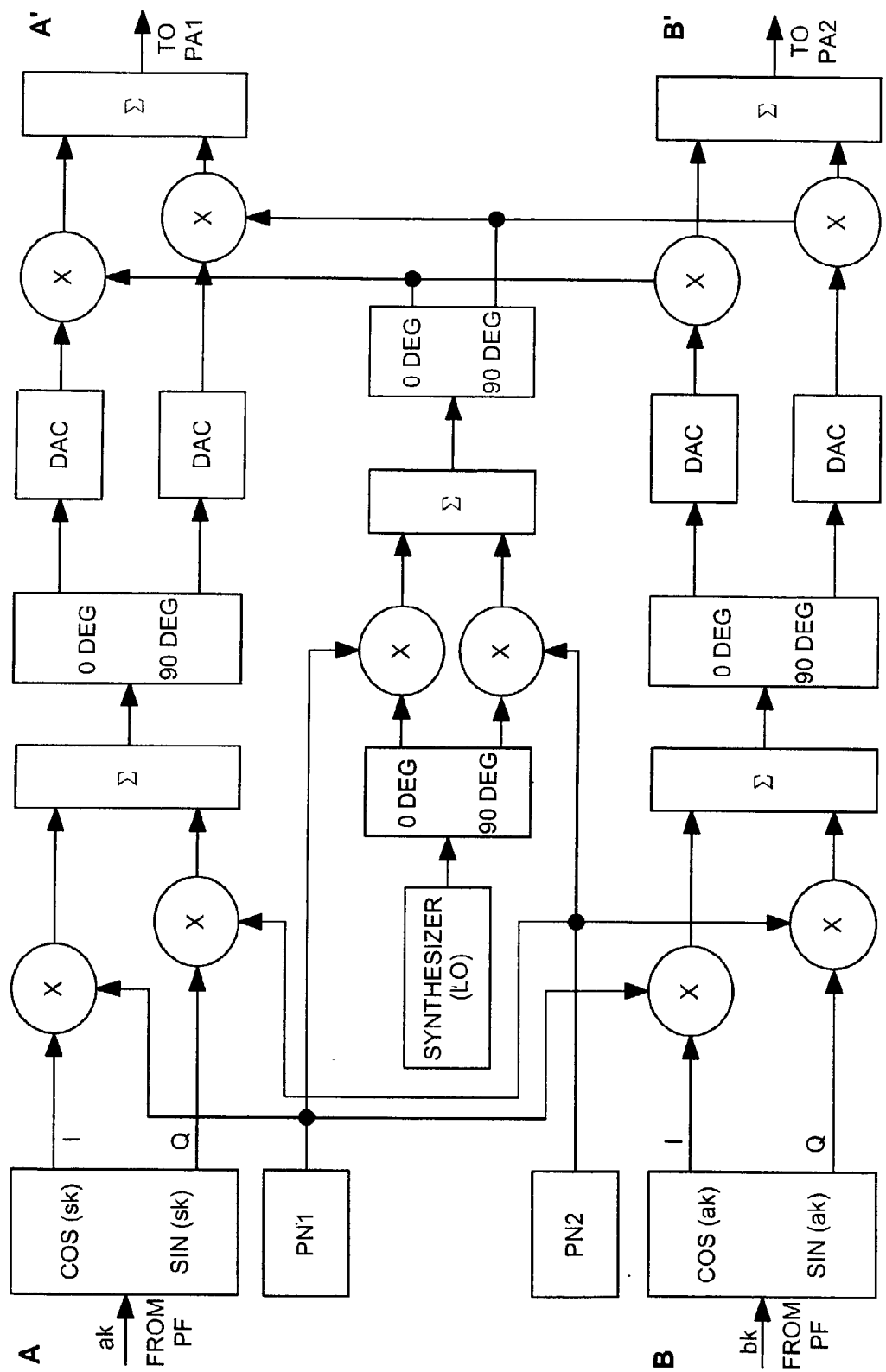
FIG. 7 is a block diagram of a circuit architecture for a pseudo-noise carrier suppression/image rejection up-converter configured according to that of FIG. 4 but driving two parallel channels (i.e. for up-converting two modulated signal fragments)

FIGS. 6 and 7 illustrate uses of the pseudo-noise carrier suppression/image rejection up-converter circuits of FIGS. 2 and 4, respectively, to up-convert baseband signals in parallel channels A–A' and B–B'. As will be seen from these figures, the BPSK or QPSK, respectively, modulated oscillator signals in these parallel channels circuits are shared by up-conversion circuitry for each baseband signal of each channel.

Figure 8:
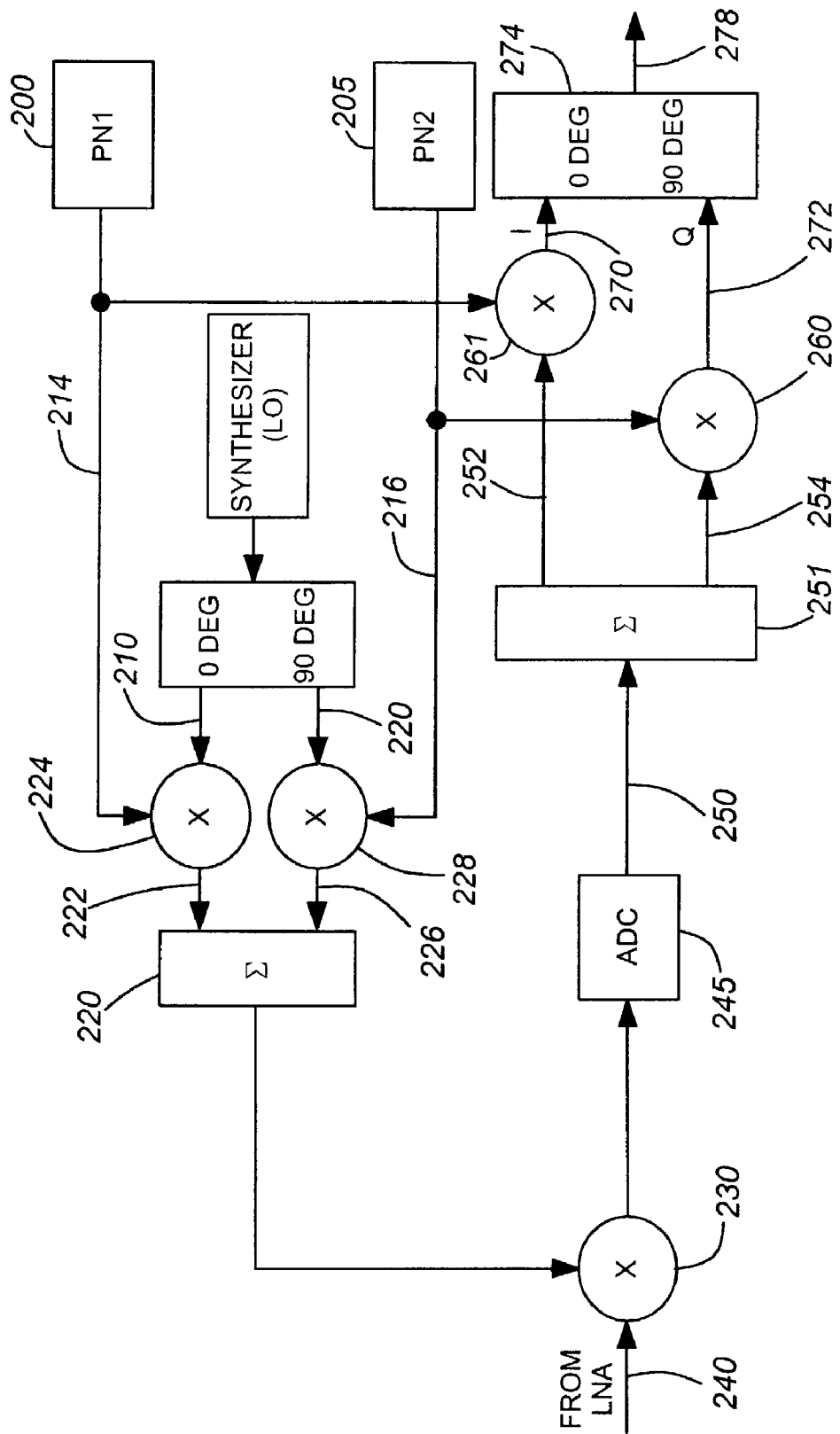
FIG. 8 is a block diagram of a circuit architecture for a pseudo-noise image rejection down-converter in accordance with another embodiment of the invention, wherein the circuitry is corresponding to the up-converter circuitry of FIG. 3 (i.e. to perform processes which are the reverse thereof; and, FIG. 9 is a block diagram of a circuit architecture for a pseudo-noise image rejection down-converter in accordance with a further embodiment of the invention, wherein the circuitry is corresponding to the up-converter circuitry of FIG. 4 (i.e. to perform processes which are the reverse thereof).

The pseudo-noise image rejection down-converter illustrated by FIG. 8 comprises circuitry which corresponds to that of the up-converter circuitry of FIG. 3. As for the up-converter circuitry, the down-conversion circuitry of FIG. 8 achieves image sideband rejection without the need for high Q filters or two-step down-conversion circuits. Here, as for the up-converter of FIG. 3, a quadrature phase shift keying (QPSK) modulated local oscillator signal (the oscillator signal corresponding to the carrier signal of the input signal to be down-converted) is used in place of the local oscillator signal used in a conventional down-converter. This is achieved by combining two binary phase shift keying (BPSK) modulated quadrature oscillator signals 222, 226, whereby the individual BPSK modulations on each quadrature oscillator signal 210, 220 are statistically independent PN sequences 214, 216 generated by PN generators 200, 205.

Following down-conversion by a mixer 230 using the QPSK modulated oscillator, and digitization by an ADC 245, the resulting QPSK spread down-converted signal 250 is separated into two parallel, identical component signals 252, 254 by a real time signal splitting operator 251 and these signals are QPSK de-spread using the PN sequences 214, 216. Signals 270, 272 are combined in-quadrature by a real time signal combining operator 274 to produce an output (baseband) signal 278. The location of the ADC is not critical and can be located following the recombination of the parallel, down-converted signals. For an alternative embodiment (not shown) the down-converted signal 250 can be QPSK de-spread by first generating two quadrature phase down-converted signals using a quadrature splitter and then QPSK de-spreading these using the independent PN sequences and an in-phase combiner.

The QPSK de-spreading of the down-converted signal cancels the QPSK modulation of the local oscillator for the desired sideband. However, for the image sideband, the phase combination of the QPSK de-spreading and the QPSK modulation results in a BPSK modulated spectrum. Since the BPSK spreading occupies a much broader spectrum than the un-spread image sideband modulation, its power spectral density is decreased. The amount of image rejection is governed by the ratio of the PN chip rate and the baseband modulation rate.

Figure 9:
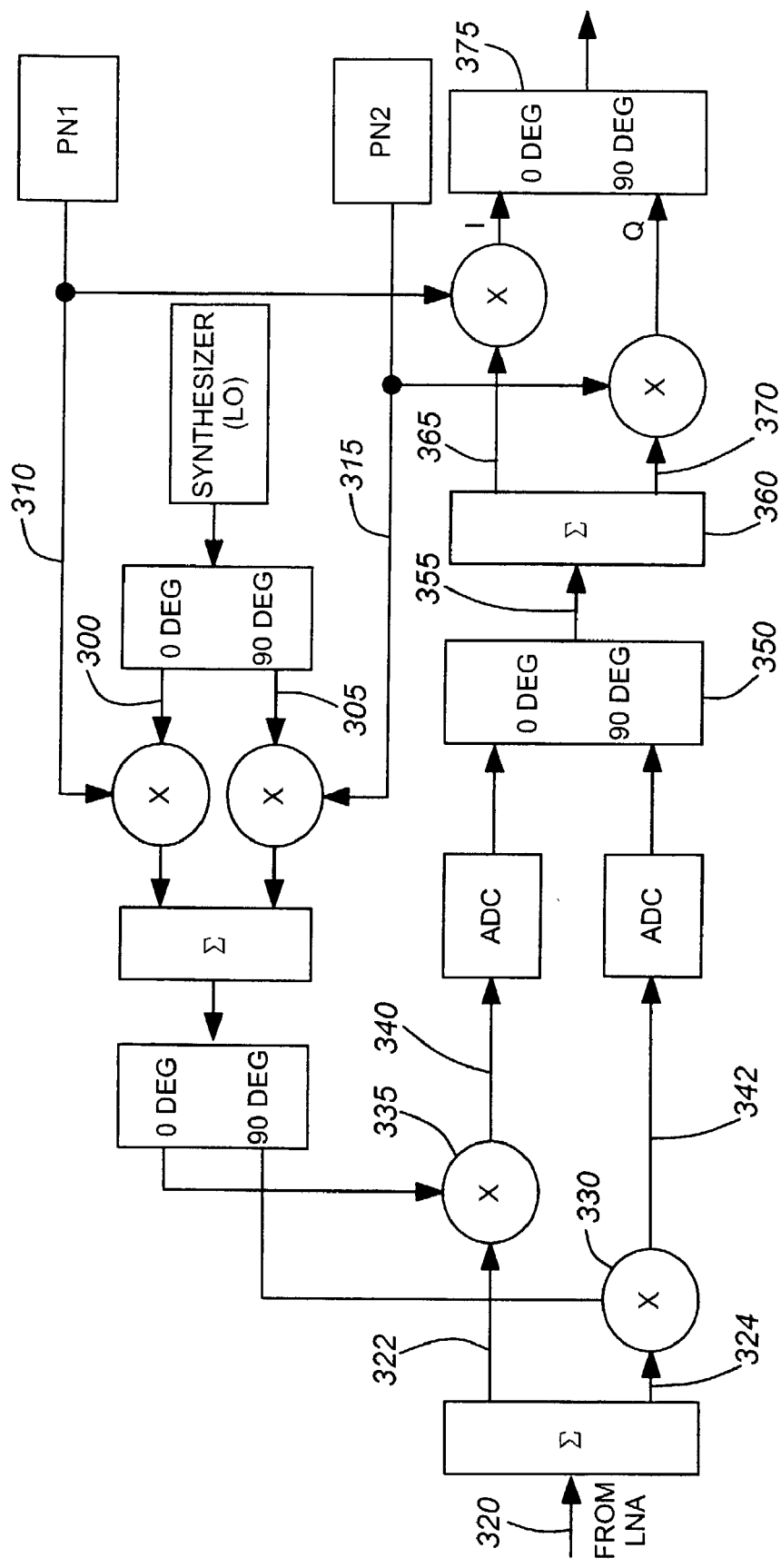

Another embodiment of a quadrature pseudo-noise image rejection down-converter is illustrated by FIG. 9 which comprises circuitry corresponding to that of the up-converter circuitry of FIG. 4. As shown, the two quadrature oscillator signals 300, 305 are each BPSK modulated with independent PN sequences 310, 315 and the BPSK modulated oscillator signals are combined to produce a QPSK modulated oscillator signal. The QPSK modulated oscillator signal is fed through a quadrature splitter, as shown, to provide quadrature QPSK modulated oscillator signals for input to mixers 330, 335.

The input signal 320 to be down-converted is split into quadrature signals 322, 324 and down-converted by mixers 330, 335. The two quadrature analog down-converted (baseband) signals 340, 342 are digitized by ADC's and combined in-quadrature by a real time signal combining operator 350 to produce a spread spectrum down-converted signal 355 which is then separated into two identical component signals by a real time signal splitting operator 360. The quadrature digital down-converted signals 365, 370 are then BPSK de-spread using the PN sequences 310, 315. The BPSK de-spreading of these down-converted signals are combined into QPSK de-spreading by the quadrature combiner 375.

The QPSK de-spreading cancels the QPSK modulation of the local oscillator for the desired sideband. However, for the image sideband, the phase combination of the QPSK de-spreading and the QPSK modulation results in a BPSK modulated spectrum. Since the BPSK spreading occupies a much broader spectrum than the un-spread image sideband modulation, its power spectral density is decreased. The amount of image rejection is governed by the ratio of the PN chip rate and the baseband modulation rate. Further image rejection is achieved upon combining the quadrature down-converted (baseband) signals by means of the quadrature combiner 375. Therefore, as for the up-converter of FIG. 4, image rejection is achieved through both phase cancellation and spread spectrum techniques.

The individual electronic and processing functions utilised in the foregoing described embodiments are, individually, well understood by those skilled in the art. It is to be understood by the reader that a variety of other implementations may be devised by skilled persons for substitution. Persons skilled in the field of communication design will be readily able to apply the present inventions to an appropriate implementation method for a given application.

Consequently, it is to be understood that the particular embodiments shown and described herein by way of illustration is not intended to limit the scope of the inventions claimed by the inventor which are defined by the appended claims.

What is claimed is:

1. A down-converter for down-converting an input signal from a carrier signal, said down-converter comprising:
    (a) means for quadrature phase shift keying (QPSK) modulating oscillator signals by independent PN signals to produce a QPSK modulated carrier signal, said oscillator signals being produced from an oscillator signal corresponding to said carrier signal;
    (b) means for down-converting said input signal with said modulated oscillator signal to produce a down-converted input signal; and,
    (c) means for quadrature phase shift keying (QPSK) de-spreading the frequency spectrum of down-converted input signals by said independent PN signals to produce an un-spread, down-converted output signal, said down-converted input signals being produced from said down-converted input signal.

2. A down-converter according to claim 1 wherein said QPSK de-spreading comprises BPSK frequency spectrum de-spreading parallel, duplicate down-converted signals by said independent PN signals and combining the resulting de-spread signals in quadrature and said QPSK modulating comprises BPSK modulating quadrature carrier signals with said independent PN signals.

3. A down-converter according to claim 1 wherein said QPSK de-spreading comprises BPSK frequency spectrum de-spreading quadrature down-converted signals by said independent PN signals and combining the resulting de-spread signals in-phase and said QPSK modulating comprises BPSK modulating quadrature carrier signals with said independent PN signals.

4. A down-converter according to claim 3 wherein said means for down-converting comprises a mixer.

5. A down-converter according to claim 4 wherein said input signal is analog and said down-converter further comprises an analog-to-digital converter (ADC).

6. Up-conversion apparatus for up-converting a first signal to a second signal with a carrier signal, said apparatus comprising:
    (a) a local oscillator configured for generating a carrier signal;
    (b) a quadrature phase splitter configured for producing quadrature carrier signals from said carrier signal;
    (c) at least two pseudorandom signal generators each configured for generating an independent pseudorandom signal;

(d) at least two BPSK modulators each configured for BPSK modulating a different one of said quadrature carrier signals with a different one of said independent pseudorandom signals;

(e) a combiner configured for combining BPSK modulated quadrature carrier signals output from two said BPSK modulators to produce a QPSK modulated carrier signal;

(f) a quadrature phase splitter configured for producing quadrature signals from said first signal;

(g) at least two signal frequency spectrum spreaders each configured for producing a BPSK spread spectrum signal of a different one of said quadrature signals produced from said first signal with a different one of said independent pseudorandom signals;

(h) a combiner configured for combining BPSK spread spectrum signals output from two said spreaders to produce a QPSK spread spectrum signal;

(i) an up-converter configured for up-converting said QPSK spread spectrum signal with said QPSK modulated carrier signal.

7. Up-conversion apparatus according to claim 6 wherein said up-converter comprises a mixer.

8. Down-conversion apparatus for down-converting a first signal on a carrier signal to a second signal, said apparatus comprising:

(a) a local oscillator configured for generating an oscillator signal corresponding to said carrier signal;

(b) a quadrature phase splitter configured for producing quadrature oscillator signals from said oscillator signal;

(c) at least two pseudorandom signal generators each configured for generating an independent pseudorandom signal;

(d) at least two BPSK modulators each configured for BPSK modulating a different one of said quadrature oscillator signals with a different one of said independent pseudorandom signals;

(e) a combiner configured for combining BPSK modulated quadrature oscillator signals output from two said BPSK modulators to produce a QPSK modulated oscillator signal;

(f) a down-converter configured for down-converting said first signal with said QPSK modulated oscillator signal to produce a down-converted first signal;

(g) a signal splitter configured for producing parallel, identical down-converted signals from said down-converted first signal;

(h) at least two signal frequency spectrum de-spreaders each configured for producing a BPSK de-spread signal of a different one of said parallel signals with a different one of said independent pseudorandom signals; and, (i) a quadrature combiner configured for combining in-quadrature said BPSK de-spread signals.

9. Down-conversion apparatus according to claim 8 wherein said down-converter comprises a mixer.

10. A method for down-converting an input signal from a carrier signal, said method comprising:

(a) quadrature phase shift keying (QPSK) modulating an oscillator signal by two independent pseudo-noise (PN) signals to produce a QPSK modulated oscillator signal, said oscillator signal corresponding to said carrier signal and said QPSK modulating comprising BPSK modulating each of two quadrature oscillator signals produced from said oscillator signal by a different one of said independent PN signals;

(b) down-converting said input signal with said modulated oscillator signal; and, (c) quadrature phase shift keying (QPSK) spreading the frequency spectrum of said down-converted input signal by said two independent pseudo-noise (PN) signals to produce an output signal of which an image sideband has reduced power spectral density from that of a desired sideband thereof, said QPSK spreading comprising BPSK spreading the frequency spectrum of each of two down-converted input signals produced from said down-converted input signal by a different one of said independent PN signals.

11. A method according to claim 10 whereby said down-converting comprises multiplying said input signal and said modulated oscillator signal.

* * * * *

UNITED STATES PATENT AND TRADEMARK OFFICE
CERTIFICATE OF CORRECTION

PATENT NO. : 7,042,927 B2  Page 1 of 1
APPLICATION NO. : 10/094826
DATED : May 9, 2006
INVENTOR(S) : Wight It is certified that error appears in the above-identified patent and that said Letters Patent is hereby corrected as shown below:

On the Title Page, Item (60) Please remove Related U.S. Application Data

Signed and Sealed this

Eleventh Day of August, 2009

David J. Kappos
*Director of the United States Patent and Trademark Office*